(12) United States Patent
Pani et al.

(10) Patent No.: US 8,341,580 B2
(45) Date of Patent: Dec. 25, 2012

(54) MODULAR ROUTING FABRIC USING SWITCHING NETWORKS

(75) Inventors: Peter M Pani, Mountain View, CA (US); Benjamin S. Ting, Saratoga, CA (US)

(73) Assignee: Advantage Logic, Inc., Cupertino, CA (US)

( * ) Notice: Subject to any disclaimer, the term of this patent is extended or adjusted under 35 U.S.C. 154(b) by 602 days.

(21) Appl. No.: 12/568,042

(22) Filed: Sep. 28, 2009

(65) Prior Publication Data

US 2011/0078648 A1    Mar. 31, 2011

(51) Int. Cl.
*G06F 17/50* (2006.01)
(52) U.S. Cl. ........ 716/116; 716/117; 716/126; 716/128; 716/129; 716/130; 326/37; 326/38; 326/39; 326/41; 326/47; 370/388
(58) Field of Classification Search ............... 716/116, 716/117, 126–130; 326/37–39, 41, 47; 370/388
See application file for complete search history.

(56) References Cited

U.S. PATENT DOCUMENTS

| | | | |
|---|---|---|---|
| 5,357,152 A | 10/1994 | Jennings et al. | |
| 5,519,629 A | 5/1996 | Snider | |
| 6,028,446 A * | 2/2000 | Agrawal et al. | 326/40 |
| 6,204,690 B1 * | 3/2001 | Young et al. | 326/41 |
| 6,594,810 B1 | 7/2003 | Reblewski et al. | |
| 6,975,139 B2 | 12/2005 | Pani et al. | |
| 7,256,614 B2 | 8/2007 | Pani et al. | |
| 7,368,943 B2 | 5/2008 | Pani et al. | |
| 7,417,457 B2 | 8/2008 | Pani et al. | |
| 7,423,453 B1 | 9/2008 | Ting et al. | |
| 7,460,529 B2 | 12/2008 | Pani et al. | |
| 7,557,613 B2 | 7/2009 | Pani et al. | |
| 7,705,629 B1 | 4/2010 | Pani et al. | |
| 7,714,611 B1 | 5/2010 | Pani et al. | |
| 2004/0150422 A1 * | 8/2004 | Wong | 326/41 |
| 2010/0327907 A1 | 12/2010 | Ting et al. | |

* cited by examiner

*Primary Examiner* — Nha Nguyen
(74) *Attorney, Agent, or Firm* — Lowenstein Sandler PC

(57) ABSTRACT

A routing fabric using multiple levels of switching networks along with associated routing matrices to allow a more uniform and shorter interconnection or routing path among logic modules or routing modules compared with those in the conventional designs. The resulting routing fabric can be used in electronic devices, such as switching networks, routers, and programmable logic circuits, etc.

21 Claims, 7 Drawing Sheets

MODULAR ROUTING FABRIC USING SWITCHING NETWORKS

TECHNICAL FIELD

Embodiments of this invention relate to interconnection schemes using switching networks as routing modules to build a routing fabric for applications in communication networks such as routers and for programmable logic circuits.

BACKGROUND

A switching network is composed of ports with pins, conductors and switches. The ports and pins are external constructs of the switching network where each port contains a plurality of pins to interface or connect to other switching networks or circuits. The conductors and switches are internal constructs of the switching network configured to transfer data or signals from pins of a first plurality of ports to pins of a second plurality of ports of the switching network; the conductors connecting to a port can be grouped as a buss. The pins of the first plurality of ports receive data or signals and transmit those data or signals through the conductors and the switches of the switching network to the pins of the second plurality of ports. The switching network can be either bi-directional where the pins of the first plurality of ports and the second plurality of ports can both receive and transmit data or signals through the conductors and switches of the switching network. The pins of the ports of the switching network are physically connected to respective conductors of the switching network. The switches of the switching network can be programmed, either one time or repeatedly, to enable connection paths among the pins of the first plurality of ports to the pins of the second plurality of ports. The connection paths connecting pins inside the switching network can sometimes involve one or more intermediate conductors coupled through switches of the switching network.

Generally, the transmission of data or signals from the first plurality of ports to the second plurality of ports through the switching network can either be single-casting, where a pin of the first plurality of ports connects to a pin of the second plurality of ports, or can be multi-casting where data or signals of a pin of the first plurality of ports are transmitted to multiple pins of respective multiple ports of the second plurality of ports. The switching network can be used in a routing fabric for systems, networks, and routers, etc. The switching network can also be used as programmable interconnect circuitry for programmable logic circuits. In the case of programmable logic circuits, the multicasting corresponds to a source (output) connecting to multiple sinks (inputs) which is generally expressed as the fan-out of an output or fan-in of the inputs. The convention stated thus far does not preclude nor restrict the switching network to be unidirectional where a signal flows only from a pin of the first plurality of ports to a pin of the second plurality of ports. Depending on actual circuit implementation, it is possible to allow a signal flowing from a pin of the second plurality of ports to a pin of the first plurality of ports of the switching network.

Interconnection or routing fabric using switching networks in hierarchy is described in U.S. Pat. Nos. 7,368,943 and 7,460,529. FIG. 1 illustrates a conventional switching system using three levels of switching networks connecting to functional blocks: four 11's: 11-1, 11-2, 11-3, 11-4 (L0's), two 12's: 12-1, 12-2 (L1's) and one 13 (L2) in hierarchy connecting to sixteen 10's: four 10-1, four 10-2, four 10-3, and four 10-4 functional blocks (FBs), where each FB in each 10-$i$ can either be a switching network coupling logical circuits or logical circuits for i=[1:4]. When each FB is a switching network coupling to logic circuits, the switching system depicted in the embodiment of FIG. 1 can be treated as having four levels of switching networks in hierarchy. Switching network 13 is the root or ancestry network of the switching system illustrated in the respective embodiments of FIG. 1 and FIG. 2 with the 10-$is$ or the FBs as the leaf cells. The interconnections in 140, 150 and 160 of FIG. 1 and FIG. 2 are respectively described as the sibling connections or couplings, the cousin connections or couplings and the tribal connections or couplings in U.S. Pat. No. 7,368,943. The difference between the embodiments of FIG. 1 and FIG. 2 are the Megacell FB 11-4 of FIG. 2 replacing 11-4, and 10-4$s$ of FIG. 1. Each of the switching networks can be a full matrix crossbar switch, a Clos network or any of the switching networks as described in U.S. Pat. Nos. 6,975,139, 7,256,614, 7,417,457, 7,557,613, U.S. patent application Ser. Nos. 12/327,702, 12/327,704 or 12/491,089, or any other switching networks; except for the case of the full matrix crossbar switch, the other types of switching networks has at least one level of intermediate conductors coupling through switches to the pins of the input ports and output ports of the respective switching networks.

It is readily determined that the interconnection or routing path (or alternatively circuit timing delay) of any part of the switching network hierarchy for adjacent siblings, cousins or tribes are shorter (thus faster) than those non-adjacent ones in the conventional designs illustrated in FIG. 1 and FIG. 2. For example, any of the FB of 10-1 of FIG. 1 and FIG. 2 connecting to non-adjacent FB of 10-3 need to use the path: (Buss 101-1→Network 13→Buss 110-2→Network 12-2→Buss 120-3→Network 11-3→FB of 10-3) or alternatively, another path: (Buss 101-1→Network 11-1→Buss 140→Network 11-2→Buss 150→Network 11-3→FB of 10-3); while for the two adjacent FBs of 10-2 and 10-3, the connection path is simply through one of the buss of 160. Similarly, in the case of adjacent cousins, 11-2 can connect to 11-3 directly using the Buss of 150 while for non-adjacent cousins such as 11-1 and 11-4, the connection path is much longer than those of adjacent cousins for the examples illustrated in FIG. 1 and FIG. 2. The network connection path for non-adjacent tribal connections is of longer path than that for adjacent tribes. Thus there is non-uniformity in routing paths with the shorter ones biased toward adjacency cases.

BRIEF DESCRIPTION OF THE DRAWINGS

Embodiments of the present invention are illustrated by way of example, and not limitation, in the figures of the accompanying drawings in which.

DETAILED DESCRIPTION

Figure 1:
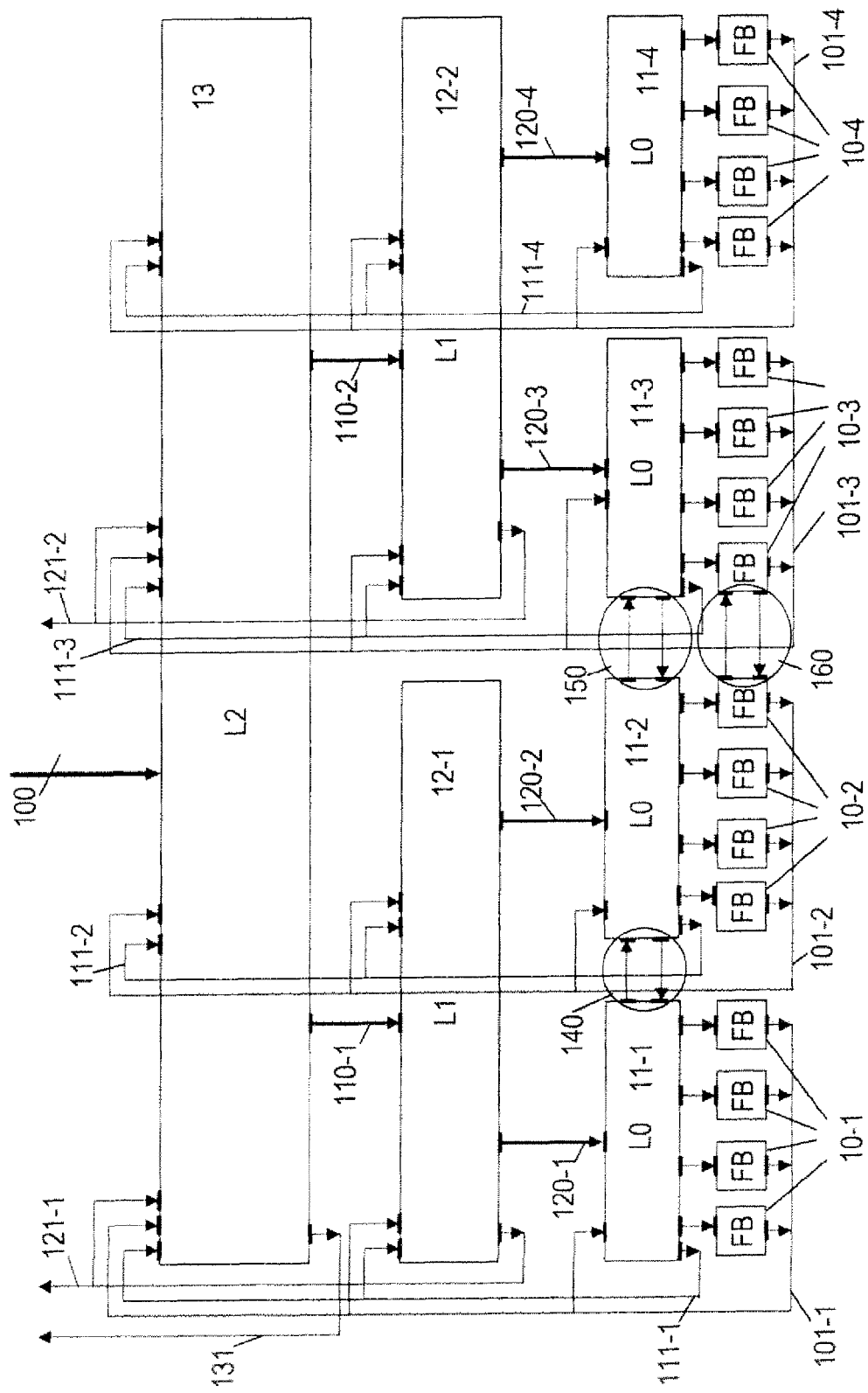
FIG. 1 illustrates a conventional routing fabric using switching networks.

In the following description, for purposes of explanation, numerous specific details are set forth in order to provide a thorough understanding of embodiments of the present invention. It will be apparent to one of ordinary skill in the art that embodiments of the present invention may be practiced without these specific details. In other instances, well-known structures and circuits are shown in block diagram form in order to avoid unnecessarily obscuring embodiments of the present invention. For purpose of description, unless otherwise specified, the term "to connect" as used in the current description may include both to directly connect and to indirectly connect (for example, inserting a driver or repeater to boost signal strength) Likewise, the term "to couple" as used herein may include both to directly couple and to indirectly couple. The illustrated representations and embodiments of the figures show each level of switching networks, where each direct ancestry or parental switching network is connected, in most cases, to at least two direct descendant or children switching networks; any one of ordinary skill in the art should appreciate that this is illustrative of cases where each parental switching network have more than two children and hence the illustrations are not meant to be limiting in any way. Furthermore, it should be readily understood that the size of each direct descendant or child amongst the children switching networks may or may not be the same. The notation X-[i:j] generally is composed of a plurality of elements X-i through X-j.

The design of an integrated circuit (IC) requires that a layout be designed which specifies the arrangement of the various circuit components that will result on the major surface of the integrated circuit substrate; that is referred to as an integrated circuit layout. In generating integrated circuit layouts, designers may typically use electronic design automation ("EDA") tools. An EDA tool generates layouts by using geometric shapes that represent different materials and components on an integrated circuit. For example, an EDA tool may use rectangular lines to represent the conductors that interconnect integrated circuit components. An EDA tool may illustrate component ports with pins on their sides. These pins connect to the interconnect conductors. A net may be defined as a collection of pins that need to be electrically connected. A list of all or some of the nets in an integrated circuit layout is referred to as a netlist. A netlist specifies a group of nets, which, in turn, specify the required interconnections between a set of pins.

In one embodiment, a machine-readable medium may be used to store data representing an integrated circuit design layout. The integrated circuit layout may be generated using a netlist or other means, for examples, schematics, text files, hardware description languages, layout files, etc. The integrated circuit layout may be converted into mask layers for fabrication of wafers containing one or more integrated circuit dies. The integrated circuit dies may then be assembled into packaged components. Design layout, mask layer generation, and the fabrication and packaging of integrated circuit dies are known in the art; accordingly, a detailed discussion is not provided herein.

It should be borne in mind, however, that all of these and similar terms are to be associated with the appropriate physical quantities and are merely convenient labels applied to these quantities. Unless specifically stated otherwise, as apparent from the following discussion, it is appreciated that throughout the description, discussions utilizing terms such as "connecting", "coupling", or the like, may refer to the action and processes of a machine, such as a computer system or similar electronic computing device, on the integrated circuit layout that manipulates and transforms data represented as physical (electronic) quantities within the machine's registers and memories into other data similarly represented as physical quantities within the machines memories or registers or other such information storage, transmission or display devices.

In the physical layout of components of an integrated circuit, it is common to refer to a conductor laid out along either a first dimension as a horizontal wire or conductor in a track or along a second dimension as a vertical wire or conductor in a track belonging to a layer of interconnections. A track is a layout unit along a dimension where one or more conductors can be laid out co-linearly along the track while conforming to manufacturing process rules in the context of a given layer of interconnections. In some embodiments, a track can be along an angular direction such as forty-five degrees, hence when we refer to a dimension such as a first dimension or a second dimension, the track can either be horizontal, vertical or of an angular direction.

It should also be noted that some embodiments of the present invention use program control devices to set the states of switches utilized. The control devices may include single-use programmable control devices, such as fuse/anti-fuse technologies, or re-programmable control devices, such as SRAM (which is volatile), FLASH (which is non-volatile), Ferro-electric (which is non-volatile), etc. Moreover, embodiments of the present invention pertain to a variety of processes, including, but not limited to, static random access memory (SRAM), dynamic random access memory (DRAM), fuse/anti-fuse, erasable programmable read-only memory (EPROM), electrically erasable programmable read-only memory (EEPROM) such as FLASH, and Ferro-electric processes.

Embodiments of the present invention may be provided as a computer program product, or software, that may include a machine-readable medium having stored thereon instructions. The computer readable medium may be used to program a computer system (or other electronic devices) to generate articles (e.g., wafer masks) used to manufacture embodiments of the present invention. The machine-readable medium may include, but is not limited to, floppy diskettes, optical disks, CD-ROMs, and magneto-optical disks, ROMs, RAMs, EPROMs, EEPROMs, magnet or optical cards, flash memory, or other type of media/machine-readable medium suitable for storing electronic instructions.

A switch connecting two wires or conductors usually has a control mechanism which can be programmed at least once. Once the control is determined and is programmed in a switch, the two conductors are either connected electrically or the circuit between the two conductors is "open" or non-conducting. There are multiple ways to implement a switch, depending on technology used and circuit design techniques. The control mechanism is generally a memory bit in re-programmable technology and anti-fuse programming lines in one-time programmable technology to select a conducting path between the two conductors through the switch. In the case where multiple numbers of incoming conductors are to be connected to a single source conductor, a multiplexer is commonly used to consolidate the many individual switches. It is generally preferable to implement the circuits of a switch or multiple consolidated switches in a contiguous area as a basic layout unit to reduce layout area.

Figure 2:
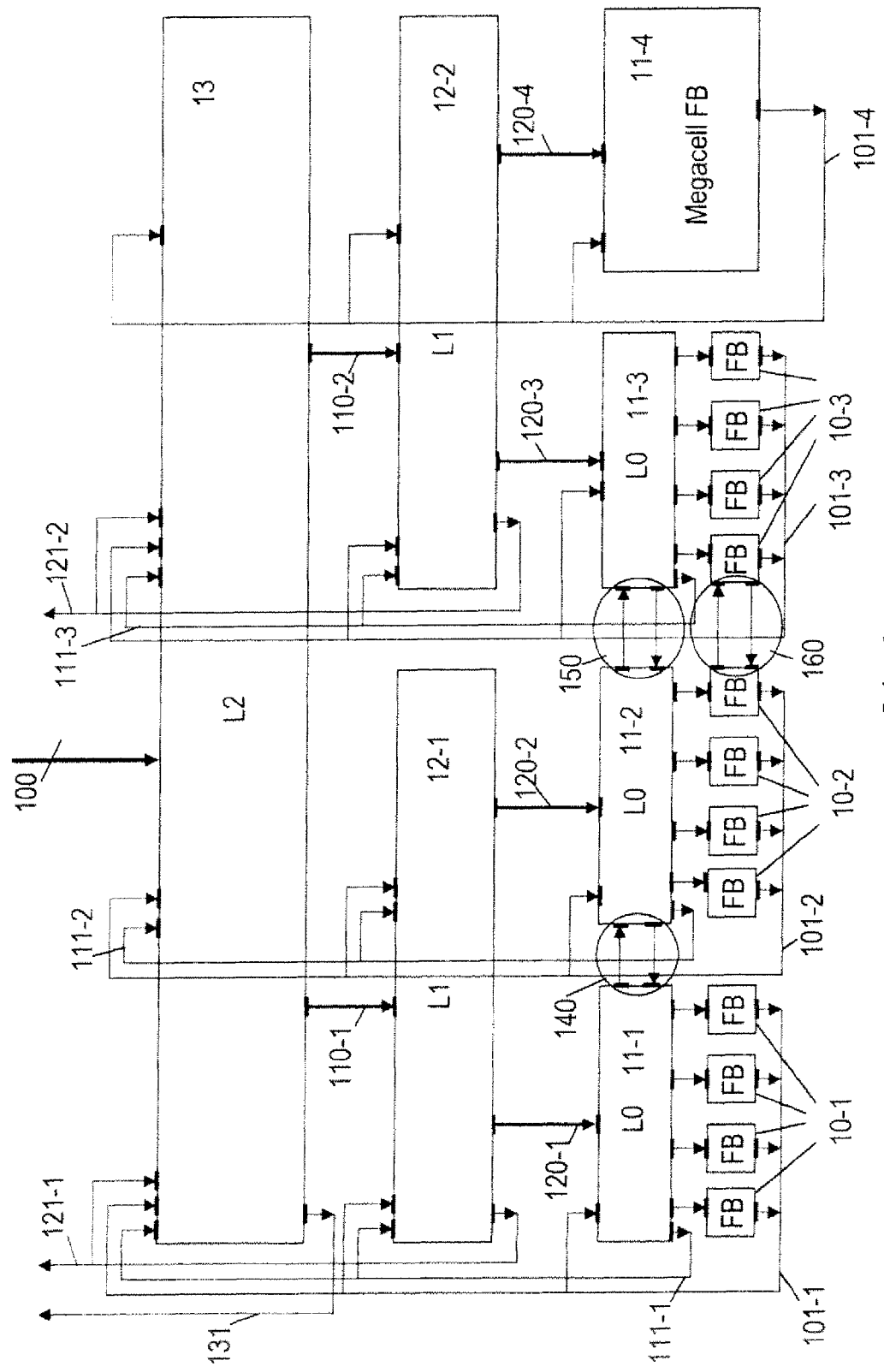
FIG. 2 illustrates a conventional routing fabric using switching networks with a Megacell Functional Block.

In the absence of the adjacent or sideway sibling, cousin and tribal connections or couplings illustrated respectively as 140, 150 and 160 in the embodiments of the conventional designs of FIG. 1 and FIG. 2, a child switching network (with respect to a parent one) is a lower level switching network where there are at least two of those lower level switching networks each has an input port receiving signals directly from the output port of a parent switching network of a higher level; for example, either 12-1 or 12-2 is a child of 13, either 11-1 or 11-2 is a child of 12-1 thus both 12-1 and 11-1 are descendants of 13 or 13 is the ancestor of both 12-1 and 11-1. A branch can be defined as a plurality of switching networks of at least two levels of switching networks composed of one root or ancestry switching network at the top-most level of the plurality of switching networks and at least two children switching networks of a lower level of switching networks of the at least two levels of switching networks; thus 13 is an ancestry or root switching network of a branch comprising all the switching networks in FIG. 1 and FIG. 2 while an alternative branch (of a cross section of a routing fabric) can be composed of 12-1 as the ancestry or switching network with 11-[1:2] and 10-[1:2] as descendant switching networks in the branch with the lowest level switching networks in the branch designated as leaf cells (the FBs in 10-1 and 10-2).

In the present application, the terms child, parent, ancestry, descendant, sibling, cousin, tribe, branch, leaf cell, etc. will be in the context of the conventional designs such as those in U.S. Pat. Nos. 7,368,943 and 7,460,529. Without overly complicating the illustrations of the described routing fabric using switching networks, the embodiments in FIG. 3 through FIG. 7 illustrates mostly a new routing matrix, which can be a switching network itself, interweaving with multiple levels of switching networks such as those described in the conventional designs of U.S. Pat. Nos. 6,975,139, 7,256,614, 7,417, 457, 7,557,613, U.S. patent application Ser. Nos. 12/327,702, 12/327,704 or 12/491,089; thus in this application, those drawings where the outputs of a parental switching network connecting to the respective input ports of the children switching networks such as 120-1 and 120-2 connecting parent switching network 12-1 to respective children switching networks 11-1 and 11-2 of FIG. 1 and FIG. 2 of the conventional designs in U.S. Pat. Nos. 7,368,943 and 7,460,529 are omitted for clarity of illustrations of the embodiments described in the present application without being limiting.

Figure 3:
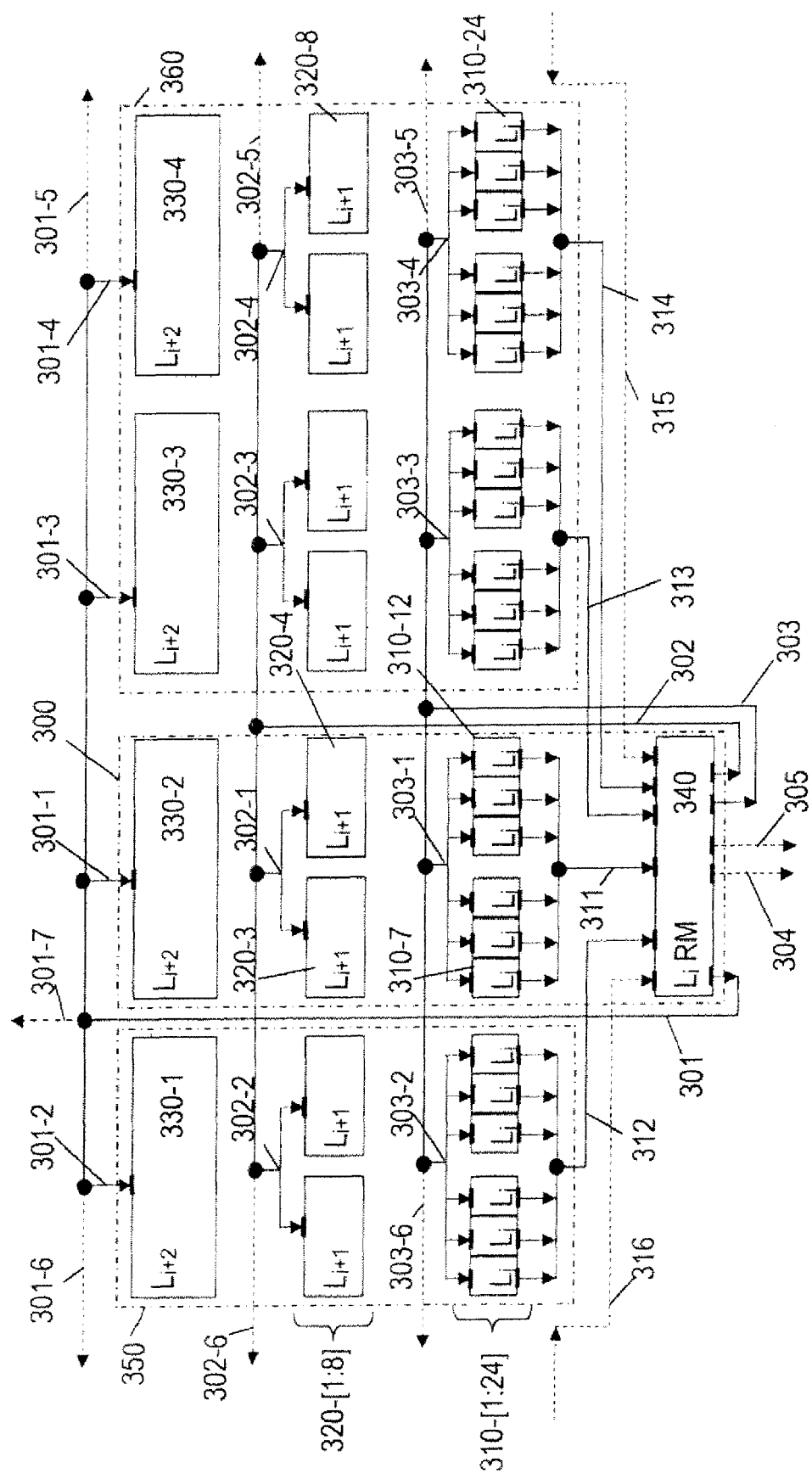
FIG. 3 illustrates one embodiment of a routing fabric using switching networks and including a routing matrix.

The embodiment of FIG. 3 illustrates a cross section of a routing fabric having three levels of switching networks: $L_{i+2}$, $L_{i+1}$ and $L_i$; each 330-$j$ ($L_{i+2}$) for j=[1:4] is a parent of two respective children 320-$q$ ($L_{i+1}$s) for q=[1:8] and each 320-$q$ ($L_{i+1}$) for q=[1:8] is a parent of three respective children 310-$r$ ($L_i$s) for r=[1:24]. In the embodiment of FIG. 3, the lowest level of the cross section, the 310-$rs$ comprising of $L_i$s are considered as the leaf cells of the cross section while the subsection of 350 comprising 330-1, 320-[1:2], 310-[1:6] is considered as a branch of the cross section. Thus a branch is composed of a plurality of leaf cells with at least one or more levels of ancestry switching networks having a common top level ancestry or root switching network. Each of the leaf cells is either a switching network or a switching network with one or more logic functional blocks, including megacell functional blocks (depicted as 325 in the embodiment of FIG. 4). Each arrow in FIG. 3 and FIG. 4 indicates the direction of possible signal flow of an associated buss comprising a plurality of conductors or pins carrying signals of a netlist and each differently labeled segment of the buss can be of varying sizes, the exact sizes are generally a function of engineering considerations such as layout or die size trade-offs versus the amount of interconnection resources to achieve routing for the desired traffic or data flow from one source to the various destinations.

Instead of the various network to network connections described in U.S. Pat. Nos. 7,368,943 and 7,460,529, the present application introduces a scheme of constructing a routing matrix associated with the leaf cells of a branch of a cross section of the routing fabric; the routing matrix itself is a switching network which is used to receive inputs from leaf cells of one or more branches and outputs to a plurality of levels of switching networks of the routing fabric. A plurality of routing matrices can be constructed to associate with the various levels of switching networks thus the routing matrices provide additional routing access which are interweaved with the interconnection resources of the various levels of switching networks using some of the schemes described in U.S. Pat. Nos. 7,368,943 and 7,460,529. As an illustration, 340 ($L_i$ RM) of FIG. 3 has input sources [311:314] from all the leaf cells 310-[1:24] plus additional ones [315, 316] (drawn as dotted buss) from leaf cells of other branches of the routing fabric where those other branches are not shown in FIG. 3. Thus a routing matrix associated with the leaf cells of a branch primarily can receive its inputs from the outputs of those leaf cells of the branch itself, the sibling leaf cells, the cousin leaf cells and the tribal leaf cells of other branches and the outputs of the routing matrix connect to the inputs of the various switching networks of the routing fabric, including those of the branch itself.

The routing matrix 340 ($L_i$ RM) in FIG. 3 has several output busses connecting to the input ports of various levels of switching networks of the routing fabric: for example, as an illustration, the 304 output buss connects to the input ports of descendant or lower level(s) of switching networks other than those of $L_i$ level of switching networks (those lower levels of switching networks are not shown in FIG. 3); the 301 output buss connects to the input ports of the $L_{i+2}$ level of switching networks 330-[1:4] of the various branches of the routing fabric including its ancestor network 330-2 in the branch of 300; the 302 output buss connects to the input ports of the $L_{i+1}$ level of switching networks 320-[1:8] of the various branches, including its ancestry networks 320-[3:4] in the branch of 300; and the 303 output buss connects to the input ports of the leaf cells of the $L_i$ level of switching networks 310-[1:24] of the various branches, including 310-[7:12] in the branch 300.

It should be readily apparent that, for one of ordinary skilled in the art, the dotted output buss 301-7 of FIG. 3 is part of the 301 output buss of the routing matrix 340 (associated with the leaf cells) which can be used as input busses to the ports of the ancestral or higher level(s) (than $L_{i+2}$ level) of switching networks of the routing fabric where those ancestral level or levels of switching networks are not shown in FIG. 3; the 301-5 and 301-6 busses are part of the 301 buss which can be used as input busses to connect or couple to other branches of the $L_{i+2}$ level of switching networks of the routing fabric where those other branches are not shown in FIG. 3; the 302-5 and 302-6 busses are part of the 302 buss which can be used as input busses to connect or couple to other branches of the $L_{i+1}$ level of switching networks of the routing fabric where those other branches are not shown in FIG. 3; and 303-5 and 303-6 busses are part of the 303 buss which can be used as input busses to connect or couple to other branches of the $L_i$ level of switching networks of the routing fabric where those other branches are not shown in FIG. 3.

Thus a routing matrix of the leaf cells of any branch of any cross section of the routing fabric such as 340 of FIG. 3 in the manner described above can be similarly constructed in the routing fabric. Since a branch is defined with respect to a cross section of the routing fabric, the $L_{i+1}$ level of switching networks 320-[3:4] together with the $L_{i+2}$ level of switching network 330-2 in 300 of FIG. 3 is also a branch with 320-[3:4] as leaf cells thus a routing matrix (similar to those described in 340) of the $L_{i+1}$ level of switching networks associated with 320-[3:4] can be similarly constructed in the manner described above. Thus a routing matrix associated with leaf cells of a branch in a cross section of the routing fabric can be constructed having a plurality of output busses originating from leaf cells of a plurality of branches connecting to the input ports of the routing matrix and a plurality of output busses of the routing matrix connecting to the input ports of a plurality of levels of switching networks in the routing fabric.

Use of a routing matrix in the routing fabric can provide a more uniform interconnection or routing path amongst leaf cells throughout the routing fabric and can shorten the interconnection path compared with the many conventional designs. The interconnection path from any of the leaf cells of the $L_i$ level of switching networks 310-[1:6] of branch 350 to the leaf cells of the $L_i$ level of switching networks 310-[13:18] of a non-adjacent branch in 360 in FIG. 3 is: (Buss 312→Network 340→Buss 303-3 to 310-[13:18]) which is similar to the case with adjacent branches such as between 350 and 300: (Buss 312→Network 340→Buss 303-3 to 310-[7:12]), thus the delay paths of both cases are more uniform in terms of switching network delays; if one equates the $L_i$ level of switching networks 310-[1:6] of FIG. 3 as the FBs 10-1 of FIG. 1 and the $L_i$ level of switching networks 310-[13:18] of FIG. 3 as the FBs 10-3 of FIG. 1, then the conventional design with the connection path: (Buss 101-1→Network 13→Buss 110-2→Network 12-2→Buss 120-3→Network 11-3 FB of 10-3) or alternatively, path: (Buss 101-1→Network 11-1→Buss 140→Network 11-2→Buss 150→Network 11-3→FB of 10-3) illustrated earlier using FIG. 1 is considerably longer than the connection path: (Buss 312→Network 340→Buss 303-3 to 310-[13:18]) just described. The introduction of a routing matrix associated with the leaf cells of a branch in a cross section of a routing fabric, with the input sources as busses from output ports of the leaf cells of one or more branches connecting to the input ports of the routing matrix and output destinations as busses of the routing matrix coupling to both the higher and lower levels of switching networks in the routing fabric, can provide both a more uniform interconnection or routing path and shorter interconnection or routing path compared with the conventional designs.

It should be noted that those connections or couplings amongst the various $L_i$, $L_{i+1}$, $L_{i+2}$ levels of switching networks described in the conventional designs of U.S. Pat. Nos. 7,368,943 and 7,460,529 are not illustrated in FIG. 3 through FIG. 7 to better focus on the schemes of the routing matrix embodiments of the present application without cluttering up the illustrations and is not intended to be limiting in any way.

The range of input busses [311:316] and output busses [301:304] to/from the routing matrix 340 illustrated in FIG. 3 is a function of desired engineering trade-offs such as routability, layout, speed considerations and software: more input sources and output destinations allow more flexible interconnection couplings thus enhancing both routability, more uniform routing path and shorter interconnection path (thus speed) at the expense of increasing layout area due to increased interconnection resources requirements of the input sources and output destinations and possible software complexity.

Figure 4:
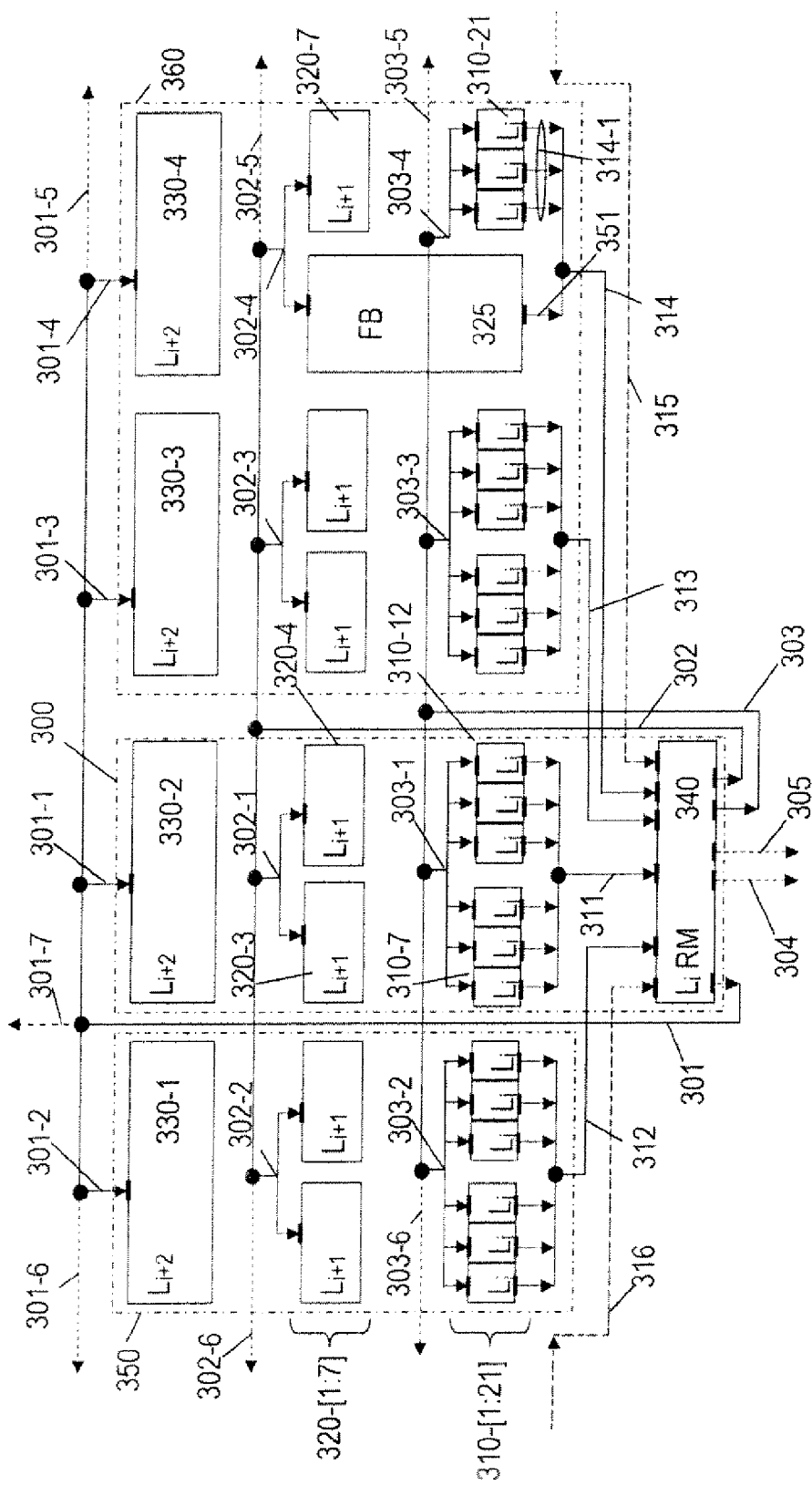
FIG. 4 illustrates one embodiment of a routing fabric using switching networks along with a routing matrix and including a Megacell Functional Block.
Figure 5:
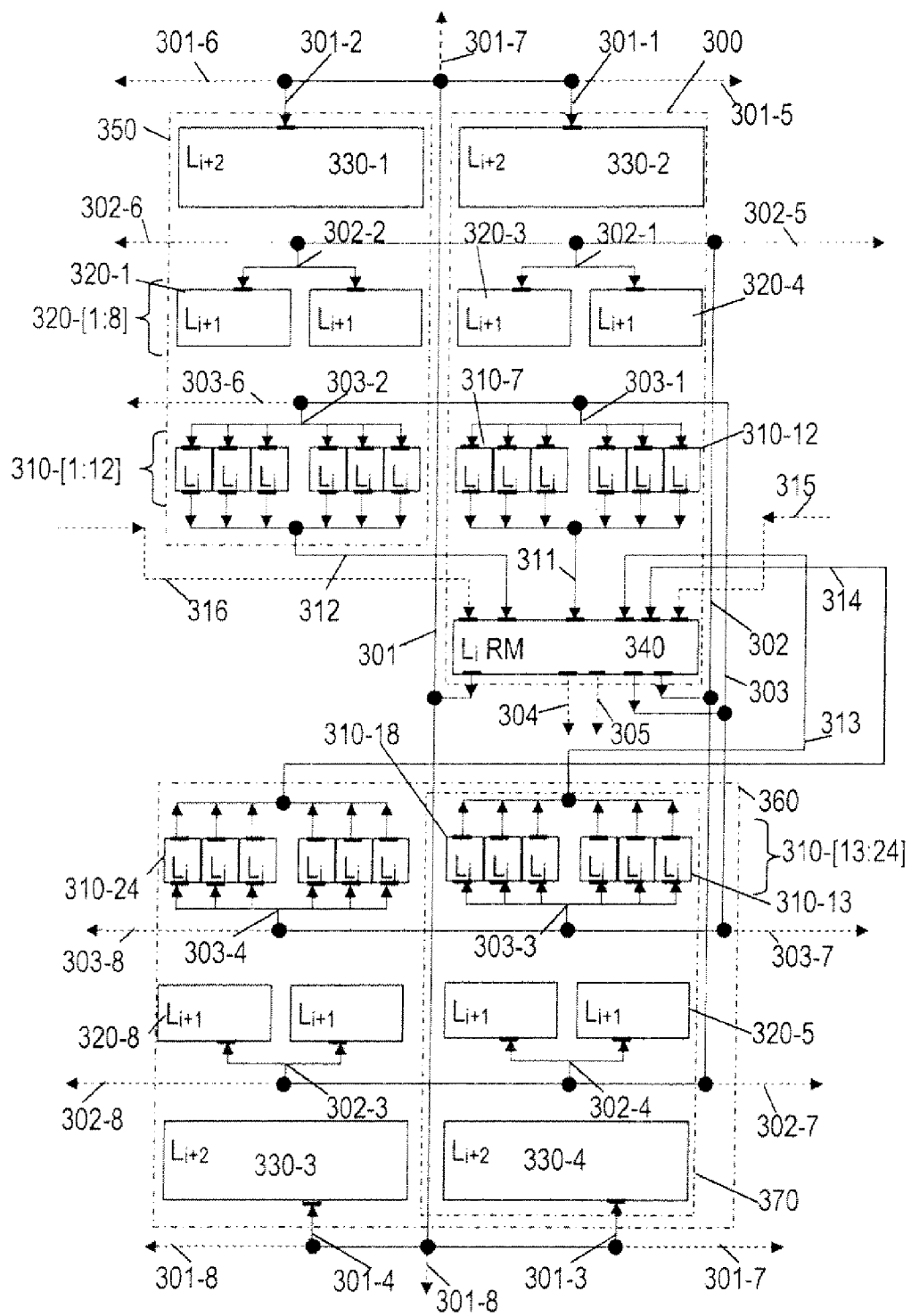
FIG. 5 illustrates an alternative embodiment of the circuits of FIG. 3 including layout considerations.
Figure 6:
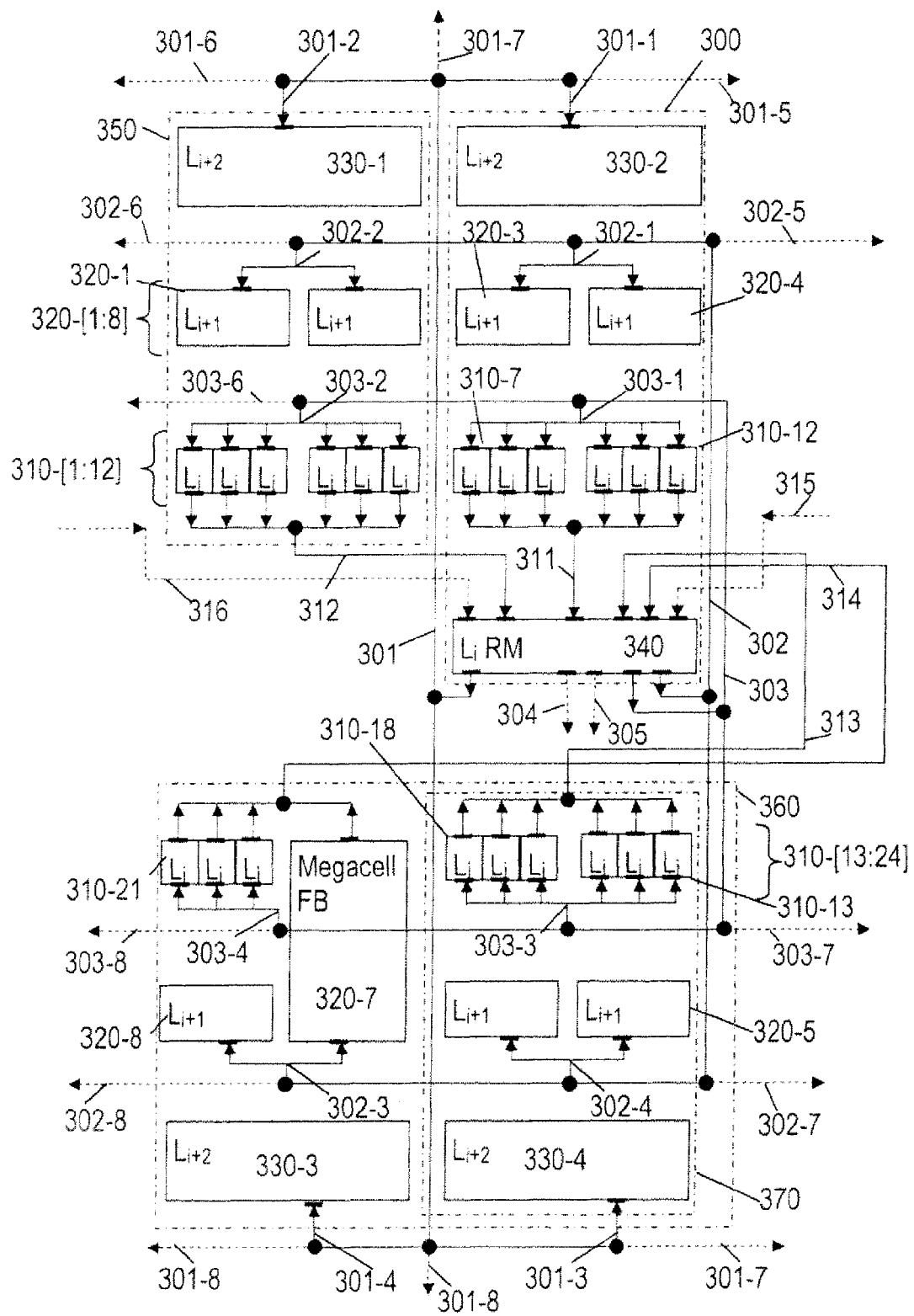
FIG. 6 illustrates an alternative embodiment of the circuits of FIG. 4 including layout considerations.

FIG. 5 and FIG. 6 are respectively alternative embodiments of the schematics of FIG. 3 and FIG. 4 indicative of physical layout considerations: the two branches of switching networks enclosed in 360 in FIG. 3 and FIG. 4 are respectively reflected and mirrored with respect to the two branches in 350 and 300 (where the corresponding routing matrix of the leaf cells of the branch in 350 is not shown). When multiple levels of switching networks are organized as branches and are physically laid out in proximity as illustrated respectively in the embodiments of FIG. 5 and FIG. 6, where the two branches in 350 and 300 and the other two branches in 360 are both respectively organized along a first dimension (horizontally) and the two branches in 350 and 300 together with the two branches in 360 are respectively organized along a second dimension (vertically), the routing matrix 340 can be shared by the two branches in 300 and 370; additionally, if the input buss 315 is from adjacent branches to 300 and 370, the layout area impact is relatively minor compared with the benefits of shorter connection path among the leaf cells of the branches. Additionally, buss 316 in FIG. 5 and FIG. 6 may be more suitable as inputs to the routing matrix associated with the leaf cells of the $L_i$ level of switching networks in the branch of 350 (which can be shared by leaf cells 310-[19:24] in FIG. 5 and leaf cells 320-7 and 310-[19:21] in FIG. 6), if the engineering objective is to reduce layout area instead of reduced interconnection path length for some outlying connections among the $L_i$ level of switching networks of different branches.

Depending on the level of switching networks in the routing fabric, the output busses [301:304] of the routing matrix 340 illustrated in FIG. 3 through FIG. 6 have similar but different considerations: if the $L_i$ level of switching networks is the base level containing logic cells and/or functional blocks (including megacells), it is desirable to have certain portions of the output busses associated with the logic cells and/or functional blocks distributed to the highest level of the routing fabric and for practical purposes this amounts to a fraction of the overall logic cell and/or functional blocks outputs which, based on the layout scheme described by the present inventors in U.S. Pat. No. 7,423,453, would not generate much of a layout overhead; thus a portion of the 301-7 buss can connect to an input port of the top level switching network of the routing fabric and in this case there is no downstream connections thus the 304 buss would be null.

Figure 7:
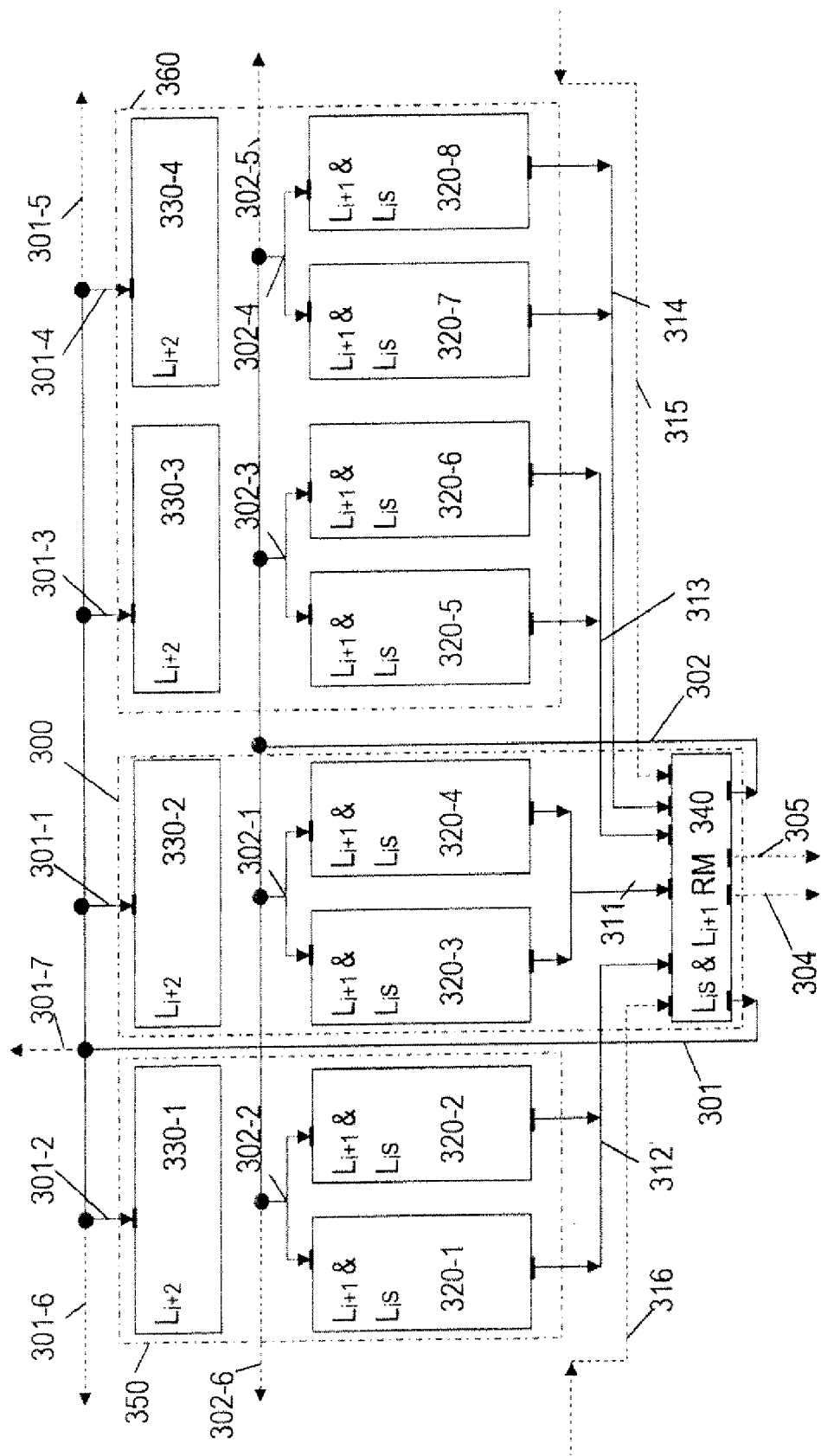
FIG. 7 illustrates an alternative embodiment of routing matrix construction of the circuits of FIG. 3 or FIG. 4.

In the case where the $L_{i+2}$ level of switching networks of FIG. 3 through FIG. 7 represents the top-most level of switching networks of the routing fabric, each associated routing matrix couples to the output busses of one or more of the $L_{i+2}$ level of switching networks and the output busses of the routing matrix connect to the input ports of a plurality of the $L_{i+2}$ level of switching networks upstream and two or more levels downstream. The branch 300 of FIG. 7 is composed of two composite levels of switching networks: the parental switching network 330-2 and the associated children switching networks 320-3 and 320-4 which are leaf cells; in the case where the routing matrix is built to have inputs from the leaf cells of the branch 300 itself only, the input busses 312, 313 and 314 would be null in FIG. 7.

It should be noted that a branch having two levels of switching networks such as the 320-3 switching network and its children 310-[7:9] or 320-4 switching network and its children 310-[10:12] of FIG. 3 and FIG. 4 can each have a respective routing matrix in place of the one 340 routing matrix illustrated in FIG. 3 and FIG. 4; the decision to have one or the other embodiment is dependent on the engineering design tradeoffs such as interconnection reach and flexibility versus layout area requirements. Similarly, an alternative embodiment of the routing matrix 340 illustrated in FIG. 5 and FIG. 6 need only have inputs from the leaf cells 310-[7:9] through buss 311 of the branch comprising 320-3 and 310-[7:9] and the same routing matrix 340 is shared by another branch comprising 320-6 and leaf cells 310-[16:18] where the leaf cells outputs are connected to the input port of the routing matrix 340 through 313 instead of the multiple branches illustrated in FIG. 5 and FIG. 6.

The top-most level of the routing fabric can have one or more switching networks in FIG. 7, in the case of just one switching network; there is no need to have an associated routing matrix, and thus the output busses of the one top-most switching network connect to the input ports of the lower level(s) switching networks. For other levels of switching networks, the output busses [301:304] of the routing matrix 340 illustrated in FIG. 3 through FIG. 6 typically need not feed up more than four levels of ancestry switching networks upstream and more than two levels of descendant switching networks downstream.

Different levels of switching networks can be merged in a branch and treated as one combined level of switching network. As an example illustration, the embodiment of FIG. 7 combines each $L_{i+1}$ level of switching network with the associated direct descendant $L_i$ level of switching networks of FIG. 3 or FIG. 4: The $L_{i+1}$ 320-1 and $L_i$ 310-[1:3] of FIG. 3 and FIG. 4 are treated as 320-1 in FIG. 7 and the representations are similarly replicated for all the 320-$is$ and 310-$js$ where 320-8 of FIG. 7 represents the combined switching networks 320-8 & 310-[22:24] of FIGS. 3 or 320-7 & 310-[19:21] of FIGS. 4 and 325 of FIG. 4 corresponds to 320-7 of FIG. 7. In the alternative representation illustrated in the embodiment of FIG. 7, the routing matrix 340 is associated with the $L_i$ level of switching networks and there is no routing matrices associated with the $L_{i+1}$ level of switching networks. Thus it is contemplated, in an alternative embodiment, certain levels of switching networks can be constructed in the manner of conventional designs such as described in U.S. Pat. Nos. 7,368,943 and 7,460,529 without the associated routing matrices which can be used as building blocks and treated as one level of combined switching networks along with the associated routing matrices in the herein described routing fabric representation; in one embodiment, at least one of such one level of combined switching networks are leaf cells which include the lowest level of switching networks.

In the alternative embodiment illustrated in FIG. 7, the routing matrix 340 is associated with the combined $L_i$ plus $L_{i+1}$ levels of switching networks and need not have those input and output busses associated with the $L_i$ level of switching networks: the 303-$is$ as input busses to the $L_i$ level of switching networks for i=[1:6] in the embodiment of FIG. 3 and hence the 303 output buss of the routing matrix 340 of FIG. 3 are not present in the alternative embodiment of FIG. 7 and thus there need not be any routing matrices associated with the $L_{i+1}$ level of switching networks.

The routing matrices associated with different levels of switching networks can couple each other. As an example illustration without drawings, using FIG. 3 as a reference: a routing matrix $L_{i+1}$ RM (which is not drawn) associated with the $L_{i+1}$ level of switching networks and specifically, 320-[1:4], of the two branches in 350 and 300 (thus a plurality of similar routing matrices of $L_{i+1}$ RM associated with the $L_{i+1}$ level of switching networks) can be constructed, similar to those illustrated in 340, with the scheme described on the construction of 340 where, for example, the output buss 305 of the routing matrix 340 are connected to one or more input busses of the respective input port(s) of one or more routing matrices $L_{i+1}$ RM associated with the $L_{i+1}$ level of switching networks, including the routing matrix $L_{i+1}$ RM associated with the 320-[1:4] switching networks. It, thus, should b readily apparent to one of ordinary skill in the art, that the routing matrices of different levels of switching networks can couple amongst each other to further enhance the flexibility of routing; the specific coupling choice is a trade-off of many considerations such as the anticipated cross traffic amongst those routing matrices, desired degree of shortened paths, layout area hence die size considerations and added software complexities.

Thus it is contemplated in the routing fabric described herein, routing matrices of different levels can be connected or coupled together where the lowest level of routing matrices taking inputs from the logic modules of the switching networks and output to the input busses of various levels of switching networks and higher level(s) of routing matrices (e.g. through the output buss 305 of FIG. 3 through FIG. 7) while the higher level(s) of routing matrices take inputs such as 305 from lower levels of routing matrices and the associated level of switching networks such as 301 through 303 and output to the input busses of various levels of switching networks. To reduce interconnection layout area and software complexity, in one embodiment which is not drawn, the higher level(s) of routing matrices taking inputs from (the output busses of) the lowest level of routing matrices such as the output buss 305 of FIG. 3 through FIG. 7 while the lowest level of routing matrices need not take inputs from those higher level(s) of routing matrices.

With respect to the nomenclatures of U.S. Pat. No. 7,368,943, the three levels of switching networks 330-1, 320-[1:2], 330-[1:6] form a branch in 350 in the cross section of a routing fabric illustrated in each of the embodiments of FIG. 3 through FIG. 6; within the branch of 350, switching network 320-1 is a sibling of switching network 320-2, switching networks 310-[1:3] are children of switching network 320-1 and switching networks 310-[4:6] are children of switching network 320-2 thus any of the switching networks 310-[1:3] is a cousin of any of the switching networks 310-[4:6]; additionally, any of the switching networks 310-[7:12] of branch 300 is of different tribes from any of the switching networks 310-[1:6] of branch 350. Based on the schemes in constructing a routing matrix of a plurality of leaf cells of a branch in a cross section of a routing fabric such as 340 illustrated in FIG. 3 through FIG. 7, the interconnection or routing paths for a plurality of leaf cells of any branch to one or more plurality of leaf cells of a plurality of branches can be more uniform and are generally shorter than those of the conventional designs.

Thus for any plurality of $L_i$ level of switching networks of a branch, each of the switching networks (which can be of a combined levels of switching networks) can output to one or more routing matrices which are associated with siblings, cousins, and/or tribes of the $L_i$ level of switching networks of the branch, including those of the branch itself and each of the switching networks can receive inputs from one or more routing matrices associated with various levels of switching networks, including those of the $L_i$ level of switching networks. It is also readily clear that, based on the schemes described in the conventional designs described in U.S. Pat. Nos. 7,368,943 and 7,460,529, the outputs of each higher level switching networks are connected or coupled to at least one input port of each of its direct descendant or children switching networks.

The illustrations and embodiments of the cross section of a routing fabric in FIG. 1 through FIG. 7 may have a symmetrical representation where, at each level of switching networks, two parental switching networks can have the same number of respective children switching networks whether the two parental switching networks are siblings, cousins, or of different tribes. It should be appreciated that the embodiments shown in FIG. 3 through FIG. 7 are some examples to illustrate the concepts and are not intended to be restricting or limiting. Any two parental switching networks of the same level of switching networks may or may not be of the same size, the respective children switching networks may or may not be of the same size, in either the number of children switching networks or the sizes of respective children switching networks. Thus, two sibling, cousin, or tribal switching networks may or may not be of the same size and may or may not have similar number of respective children switching networks. Furthermore, some portions of the switching networks along a particular branch may have one or more Megacell Functional Blocks such as 325 and 320-7 respectively illustrated in FIG. 4 and FIG. 6. The Megacell Functional Block may be a super regional switching network in a communication network or contains a megacell, such as a microprocessor or microcontroller.

The schemes outlined in the embodiments of FIG. 3 through FIG. 7 can be applied throughout the routing fabric. The schemes allow more uniform communication paths amongst leaf cells of the same level of switching networks whether they are siblings, cousins, and/or tribal switching networks and those communications paths are generally shorter than those of the conventional designs.

Thus, various embodiments of a scheme in providing a routing fabric using multiple levels of switching networks as routing modules along with associated routing matrices have been described.

The foregoing discussion merely describes some exemplary embodiments of the present invention. One of ordinary skill in the art will readily recognize from such discussion, the accompanying drawings, and the claims that various modifications can be made without departing from the spirit and scope of the appended claims. The description is thus to be regarded as illustrative instead of limiting.

What is claimed is:

1. A routing fabric in an integrated circuit, comprising:
a plurality of branches, where each branch comprises at least two consecutive levels of switching networks,
wherein the at least two consecutive levels of switching networks of each branch comprises one ancestry switching network of the highest level of switching networks of the at least two consecutive levels of switching networks and a plurality of leaf cells comprising a plurality of descendant switching networks of the lowest level of switching networks of the at least two consecutive levels of switching networks;
a routing matrix of the plurality of leaf cells of each branch of the plurality of branches;
wherein each of the switching networks of each branch and the routing matrix of the plurality of leaf cells of each branch comprises a respective first plurality of ports and a respective second plurality of ports,
wherein each port of the first plurality of ports and the second plurality of ports of each switching network of each branch and the routing matrix of the plurality of leaf cells of each branch comprises a plurality of pins, and
wherein, for each respective switching network of each branch, the pins of the first plurality of ports selectively couple to the pins of the second plurality of ports through switches of the respective switching network, and
wherein, for each respective routing matrix of each branch, the pins of the first plurality of ports selectively couple to the pins of the second plurality of ports through switches of the respective routing matrix;
wherein the pins of a plurality of ports of the first plurality of ports of a first routing matrix of a first branch of the plurality of branches are connected to the pins of a plurality of the second plurality of ports of a plurality of leaf cells of the first branch; and
wherein the pins of a plurality of ports of the second plurality of ports of the first routing matrix are directly connected to the pins of the first plurality of ports of each switching network of the at least two levels of switching networks of at least two branches of the plurality of branches.

2. The routing fabric of claim 1, wherein the pins of a plurality of ports of the first plurality of ports of the first routing matrix are connected to the pins of a plurality of the second plurality of ports of a plurality of leaf cells of at least two branches of the plurality of branches.

3. The routing fabric of claim 2, wherein the first branch, the first routing matrix and the second branch are organized along a first dimension.

4. The routing fabric of claim 3, wherein the pins of a plurality of ports of the first plurality of ports of the first routing matrix are connected to the pins of a plurality of the second plurality of ports of a plurality of leaf cells of a third branch,
wherein the first branch and the third branch are organized along a second dimension;
wherein the pins of a plurality of ports of the first plurality of ports of the first routing matrix are connected to the pins of a plurality of the second plurality of ports of a plurality of leaf cells of a fourth branch,
wherein the second branch and the fourth branch are organized along the second dimension.

5. The routing fabric of claim 3, wherein the pins of at least one port of the second plurality of ports of the first routing matrix are connected to the pins of at least one port of the first plurality of ports of at least one ancestry switching network of a higher level than the first branch.

6. The routing fabric of claim 3, wherein the pins of at least one port of the second plurality of ports of the first routing matrix are connected to the pins of at least one port of the first plurality of ports of at least one descendant switching network of a lower level than the first branch.

7. The routing fabric of claim 1, wherein the pins of at least one port of the second plurality of ports of the first routing matrix are connected to the pins of at least one port of the first plurality of ports of at least one descendant switching network of a lower level than the first branch.

8. A method of routing in an integrated circuit, comprising:
providing, by using a computer, a plurality of branches, where each branch comprises at least two consecutive levels of switching networks,
wherein the at least two consecutive levels of switching networks of each branch comprises one ancestry switching network of the highest level of switching networks of the at least two consecutive levels of switching networks and a plurality of leaf cells comprising a plurality of descendant switching networks of the lowest level of switching networks of the at least two consecutive levels of switching networks;
providing a routing matrix of the plurality of leaf cells of each branch of the plurality of branches;
wherein each of the switching networks of each branch and the routing matrix of the plurality of leaf cells of each branch comprises a respective first plurality of ports and a respective second plurality of ports,
wherein each port of the first plurality of ports and the second plurality of ports of each switching network of each branch and the routing matrix of the plurality of leaf cells of each branch comprises a plurality of pins;
selectively coupling, for each respective switching network of each branch, the pins of the first plurality of ports to the pins of the second plurality of ports through switches of the respective switching network;
selectively coupling, for each respective routing matrix of each branch, the pins of the first plurality of ports to the pins of the second plurality of ports through switches of the respective routing matrix;
connecting the pins of a plurality of ports of the first plurality of ports of a first routing matrix of a first branch of the plurality of branches to the pins of a plurality of the second plurality of ports of a plurality of leaf cells of the first branch; and connecting the pins of a plurality of the second plurality of ports of the first routing matrix to the pins of the first plurality of ports of each switching network of the at least two levels of switching networks of at least two branches of the plurality of branches.

9. The method of claim 8, further comprising connecting the pins of a plurality of ports of the first plurality of ports of the first routing matrix to the pins of a plurality of the second plurality of ports of a plurality of leaf cells of at least two branches of the plurality of branches.

10. The method of claim 9, further comprising wherein the first branch, the first routing matrix and the second branch are organized along a first dimension.

11. The method of claim 10, further comprising:
connecting the pins of a plurality of ports of the first plurality of ports of the first routing matrix to the pins of a plurality of the second plurality of ports of a plurality of leaf cells of a third branch, wherein the first branch and the third branch are organized along a second dimension;
connecting the pins of a plurality of ports of the first plurality of ports of the first routing matrix to the pins of a plurality of the second plurality of ports of a plurality of leaf cells of a fourth branch, wherein the second branch and the fourth branch are organized along the second dimension.

12. The method of claim 10, further comprising connecting the pins of at least one port of the second plurality of ports of the first routing matrix to the pins of at least one port of the first plurality of ports of at least one ancestry switching network of a higher level than the first branch.

13. The method of claim 10, further comprising connecting the pins of at least one port of the second plurality of ports of the first routing matrix to the pins of at least one port of the first plurality of ports of at least one descendant switching network of a lower level than the first branch.

14. The method of claim 8, further comprising connecting the pins of at least one port of the second plurality of ports of the first routing matrix to the pins of at least one port of the first plurality of ports of at least one descendant switching network of a lower level than the first branch.

15. A computer readable storage medium having instructions stored therein, that, when executed by a computer system, cause the computer system to perform a method comprising:
providing a plurality of branches, where each branch comprises at least two consecutive levels of switching networks,
wherein the at least two consecutive levels of switching networks of each branch comprises one ancestry switching network of the highest level of switching networks of the at least two consecutive levels of switching networks and a plurality of leaf cells comprising a plurality of descendant switching networks of the lowest level of switching networks of the at least two consecutive levels of switching networks;
providing a routing matrix of the plurality of leaf cells of each branch of the plurality of branches;
wherein each of the switching networks of each branch and the routing matrix of the plurality of leaf cells of each branch comprises a respective first plurality of ports and a respective second plurality of ports,
wherein each port of the first plurality of ports and the second plurality of ports of each switching network of each branch and the routing matrix of the plurality of leaf cells of each branch comprises a plurality of pins;
selectively coupling, for each respective switching network of each branch, the pins of the first plurality of ports to the pins of the second plurality of ports through switches of the respective switching network;
selectively coupling, for each respective routing matrix of each branch, the pins of the first plurality of ports to the pins of the second plurality of ports through switches of the respective routing matrix;
connecting the pins of a plurality of ports of the first plurality of ports of a first routing matrix of a first branch of the plurality of branches to the pins of a plurality of the second plurality of ports of a plurality of leaf cells of the first branch; and
connecting the pins of a plurality of the second plurality of ports of the first routing matrix directly to the pins of the first plurality of ports each switching network of the at least two levels of switching networks of at least two branches of the plurality of branches.

16. The computer-readable storage medium of claim 15, wherein the method further comprises connecting the pins of a plurality of ports of the first plurality of ports of the first routing matrix to the pins of a plurality of the second plurality of ports of a plurality of leaf cells of at least two branches of the plurality of branches.

17. The computer-readable storage medium of claim 15, wherein the method further comprises further comprising connecting the pins of at least one port of the second plurality of ports of the first routing matrix to the pins of at least one port of the first plurality of ports of at least one descendant switching network of a lower level than the first branch.

18. The computer-readable storage medium of claim 15, further comprising wherein the first branch, the first routing matrix and the second branch are organized along a first dimension.

19. The computer-readable storage medium of claim 18, further comprising:
connecting the pins of a plurality of ports of the first plurality of ports of the first routing matrix to the pins of a plurality of the second plurality of ports of a plurality of leaf cells of a third branch, wherein the first branch and the third branch are organized along a second dimension;
connecting the pins of a plurality of ports of the first plurality of ports of the first routing matrix to the pins of a plurality of the second plurality of ports of a plurality of leaf cells of a fourth branch, wherein the second branch and the fourth branch are organized along the second dimension.

20. The computer-readable storage medium of claim 18, further comprising connecting the pins of at least one port of the second plurality of ports of the first routing matrix to the pins of at least one port of the first plurality of ports of at least one ancestry switching network of a higher level than the first branch.

21. The computer-readable storage medium of claim 18, further comprising connecting the pins of at least one port of the second plurality of ports of the first routing matrix to the pins of at least one port of the first plurality of ports of at least one descendant switching network of a lower level than the first branch.

* * * * *